United States Patent [19]

Lu et al.

[11] Patent Number: 6,120,842
[45] Date of Patent: Sep. 19, 2000

[54] TIN+AL FILMS AND PROCESSES

[75] Inventors: Jiong-Ping Lu; Wei-Yung Hsu; Qi-Zhong Hong, all of Dallas, Tex.

[73] Assignee: Texas Instruments Incorporated, Dallas, Tex.

[21] Appl. No.: 08/954,989

[22] Filed: Oct. 21, 1997

[51] Int. Cl.$^7$ .................................................. H01L 21/302
[52] U.S. Cl. .................... 427/250; 427/252; 427/253; 427/255.2; 427/419.7; 438/653; 438/688
[58] Field of Search .................................... 438/653, 688; 427/250, 252, 253, 255.2, 419.7, 419.8

[56] References Cited

U.S. PATENT DOCUMENTS

| | | | |
|---|---|---|---|
| 5,341,026 | 8/1994 | Harada et al. | 257/764 |
| 5,371,042 | 12/1994 | Org | 437/194 |
| 5,523,626 | 6/1996 | Hayashi et al. | 257/763 |
| 5,668,411 | 9/1997 | Hong et al. | 257/751 |
| 5,747,361 | 5/1998 | Ouellet | 437/190 |
| 5,998,296 | 12/1999 | Saran et al. | 438/685 |
| 6,017,818 | 1/2000 | Lu | 438/653 |
| 6,037,013 | 3/2000 | Hsu et al. | 427/535 |

FOREIGN PATENT DOCUMENTS

| | | |
|---|---|---|
| 195 15 564 A1 | 11/1995 | Germany . |
| 54 158 775 | 12/1979 | Japan . |
| 63-174319 | 7/1988 | Japan . |

OTHER PUBLICATIONS

"Atomic Force Microscopy Study On Topography of Films Produced By Ion–Based Techniques", J. Appl. Phys., vol. 80, No. 5, pp. 2658–2664; Wang et al., Sep. 1, 1996.

Li, et al.: "Structural Characterization of Aluminum Films Deposited on Sputtered–Titanium Nitride/Silicon Substrate by Metalorganic Chemical Vapor Deposition From Dimethylethylamine Alane" Applied Physics Letters, vol. 67, No. 23, $ Dec. 1995, pp. 3426–3428, XP000541618.

Dixit G. A., et al: "A Novel 0.25 mum Via Plug Process Using Low Temperature CVD A1/TIN" Technical Digest of the International Electron Devices Meeting (IEDM), Washington, Dec. 10–13, 1995, Institute Of Electrical And Electronic Engineers, pp. 1001–1003, XP000624827.

Eizenberg M, et al: TICN: A New Chemical Vapor Deposited Contact Barrier Metallization For Submicron Devices: Applied Physics Letters, vol. 65, No. 19, Nov. 7, 1994, pp. 2416–2418, XP000476548.

Sang–Hyeob Lee, et al.: Compositionally Gradient (TI1–ZALX) N Coatings made by Plasma Enhanced Chemical Vapor Deposition: Journal of Vacuum Science and Technology: Part A, vol. 13, No. 4, Jul. 1, 1995, pp. 2030–2034, XP000540937.

Sandhu G. S., et al: "Metalorganic Chemical Vapor Deposition of TiN Films for Advanced Metallization" Applied Physics Letters, vol. 62, No. 3, Jan. 18, 1993, pp. 240–242, XP000334800.

Inoue, et al., Structure and composition of (Ti, Al) N films prepared by r.t. planar magnetron sputtering using a composite target, 271 Thin Solid Films (1995) pp. 15–18.

Lee and Lee, Compositionally gradient $(Ti_{1-x}Al_x)N$ coatings made by plasma enhanced chemical vapor deposition, J. Vac. Sci. Techonology A 13(4), Jul./Aug. 1995, pp. 2030–2034.

Wahlstrom, et al., Crystal growth and microstructure of polycrystalline $Ti_{1-x}Al_xN$ alloy films deposited by ultra–high–vacuum dual–target magnetron sputtering, Thin Solid Films 235 (1993) pp. 62–70.

Lee, et al., $(Ti_{1-x}Al_x)N$ coatings by plasma–enhanced chemical vapor deposition, J. Vac. Sci. Technology A 12(4), Jul./Aug. 1994, pp. 1602–1607.

*Primary Examiner*—William Powell
*Assistant Examiner*—George Goudreau
*Attorney, Agent, or Firm*—Mark A. Valetti; Carlton H. Hoel; Frederick J. Telecky, Jr.

[57] ABSTRACT

A process for producing conformal and stable TiN+Al films, which provides flexibility in selecting the chemical composition and layering. In this new process, porous TiCN is first deposited, and then Al is incorporated by exposing the porous film to CVD aluminum conditions at low temperatures.

10 Claims, 4 Drawing Sheets

TiN+AL FILMS AND PROCESSES

BACKGROUND AND SUMMARY OF THE INVENTION

The present invention relates to integrated circuit structures and fabrication methods.

Ever since the mid-1980s, titanium nitride (TiN) has been a very common material for diffusion barrier layers in integrated circuit fabrication. However, with the increased demands on metallization and interconnect technology in the late 1990s, there is an increasing need for thin film structures with better diffusion-barrier and adhesion properties.

Ti—Al—N films have been proposed as one alternative. Ti—Al—N films are attractive for diffusion barriers in integrated circuit fabrication. The use of aluminum in the composition (instead of a pure TiN composition) produces an amorphous thin film, which is desirable for a diffusion barrier (since diffusion pathways along grain boundaries are eliminated). In such applications the Al fraction will form a thin but durable native oxide (which is primarily $Al_2O_3$), so the material (like aluminum metal, but unlike TiN) self-passivates itself on exposure to air. See generally, e.g., Lee et al., "$(Ti_{1-x}Al_x)N$ coatings by plasma-enhanced chemical vapor deposition," 12 J. VAC. Sci. TECHNOL. A 1602 (1994); Wahiström et al., "Crystal growth and microstructure of polycrystalline $Ti_{1-x}Al_xN$ alloy films deposited by ultra-high-vacuum dual-target magnetron sputtering," 235 THIN SOLID FILMS 62 (1993); Lee and Lee, "Compositionally gradient $(Ti_{1-x}Al_x)N$ coatings made by plasma enhanced chemical vapor deposition," 13 J. VAC. SCI. TECHNOL. A 2030 (1995); Inoue et al., "Structure and composition of (Ti, Al)N films prepared by r.f. planar magnetron sputtering using a composite target," 271 THIN SOLID FILMS 15 (1995); all of which are hereby incorporated by reference.

Ti—Al—N films are also attractive for hard coatings for solid objects. Titanium nitride is often used for a friction-reducing or decorative layer, but is not stable against oxidation, and hence some protective overcoat is usually used. However, this increases the cost of such films, and may also reduce their durability.

Ti—Al—N films are normally made by one of two methods: reactive sputtering (PVD) using Ti—Al alloy targets in a nitrogen atmosphere; or by CVD using $TiCl_4$+ $NH_3$ +$AlCl_3$. Reactive sputtering processes suffer from poor step coverage and limited range of Al/Ti ratio, while CVD processes require high substrate temperatures during deposition (which is a problem for multilayer metallization). CVD processes also risk a corrosive residue (e.g. Cl) and particle generation due to gas phase reactions.

Innovative Structures and Methods

The present application introduces a new process for producing films containing titanium, aluminum, and nitrogen that overcome the shortcomings of the other processes outlined above. In the disclosed new processes, porous TiN is first deposited, and then Al is deposited onto and into the pores of the porous film. This produces a multilayer highly planar film which has an aluminum-rich surface layer (which may be metallic aluminum, or aluminum nitride, or a mixture thereof). Upon exposure to atmosphere, this will form a hard oxide film which passivates the film against further oxidation. The films made by this method can be given different chemical compositions as compared with other methods, and also offer additional advantages. The new TiN+Al film structures provide easier deposition than conventional Ti—Al—N films. As compared with PVD methods for Ti—Al—N film deposition, the new TiN+Al deposition methods give better step coverage, and permit a wider range of chemical composition. As compared with the $TiCl_4$+$AlCl_3$+$NH_3$ CVD processes for Ti—Al—N film deposition, the new TiN+Al deposition methods give reduced particulates, allow lower deposition temperature, and do not leave any corrosive residue.

Thus the disclosed methods provide the advantages of:

good step coverage;

minimized particle generation;

flexibility in selecting chemical composition; and high manufacturability.

The structures produced by this new method are particularly useful for diffusion barriers for multilevel interconnect technology, and for capacitor plates in high density DRAM storage capacitors with perovskite oxide dielectrics (e.g. barium strontium titanate or PLZT). The disclosed methods can also advantageously be used to deposit a self-passivating hard coating on solid objects.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In general, particulate formation, during deposition of thin films containing titanium and nitrogen, can be reduced by incorporating aluminum after deposition of the TiN film without using $TiCl_4$, $AlCl_3$ and $NH_3$. This innovative process does not leave any corrosive residue, increases the stability of the TiN films, and offers excellent step coverage.

Figure 1:
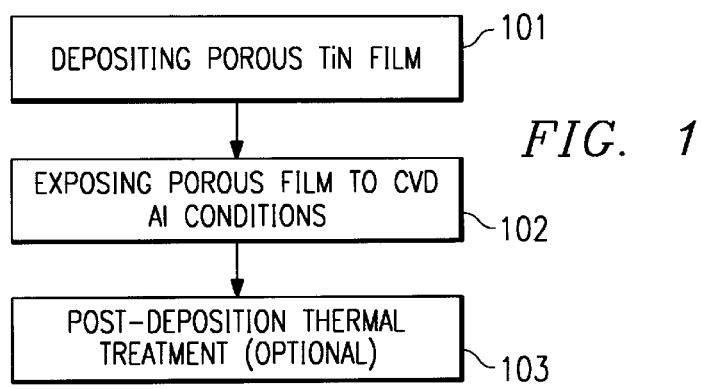
FIG. 1 shows a process flow for preparing the film.

A sample process flow for fabricating TiN+Al films is shown schematically in FIG. 1. This process is carried out using conventional chemical vapor deposition (CVD) systems.

The first step (step 101) includes depositing a porous TiN film, preferably, via thermal decomposition of Ti(NRR')$_4$, where R, R' can each be methyl or ethyl. This is a metal-organic chemical vapor deposition (MOCVD) with excellent step coverage for the resulting TiN film.

Following this deposition step (step 101), the porous film is exposed to CVD aluminum conditions (step 102) to introduce Al into the film and onto the surface of the film. The CVD aluminum conditions are preferably applied for long enough to deposit at least 50 Å of metallic aluminum on top of the TiN layer (and more preferably 100 Å), as well as filling in any porosity or roughness in the TiN layer. The aluminum-rich surface layers will react with oxygen, on exposure to air, to form a durable native oxide (which is primarily Al$_2$O$_3$). Thus the layers formed by the disclosed methods will self-passivate on exposure to air (like aluminum metal, but unlike TiN).

The surface layer preferably has an Al to Ti ratio of at least 5:1, and more preferably 10:1 or much higher (up to infinity). This is most easily achieved by performing aluminum deposition long enough that a thin layer of metallic aluminum is formed at the very surface. Alternatively and less preferably, if the surface can be sufficiently aluminum-enriched to form a hard alumina-like native oxide, this metallic layer can less preferably be made thinner or of zero thickness.

Optionally, the TiN+Al film can be subjected to post-deposition thermal treatments (step 103) to further stabilize the barrier layer (by increasing the aluminum nitride zone).

Figure 4:
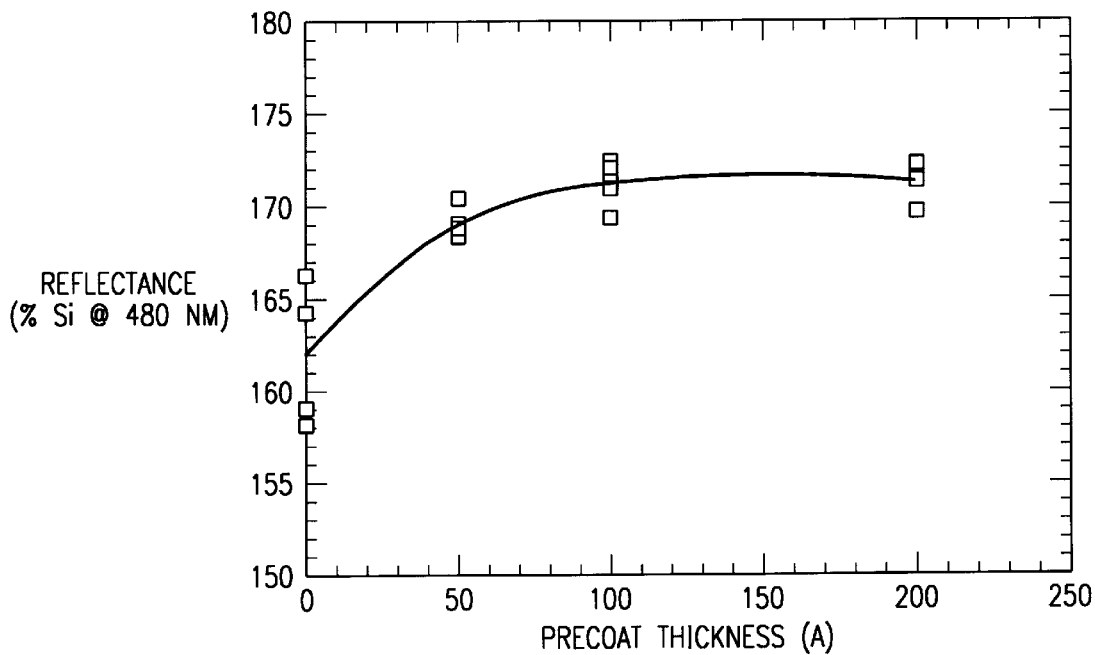
FIG. 4 presents data showing how a TiN layer nucleates deposition of aluminum.

MOCVD TiN has been shown to be an excellent nucleating layer for CVD Al, as shown in FIG. 4. The data shows the reflectance of a 3000 Å CVD Al film deposited on a 500 Å CVD TiN film as a function of the CVD TiN precoat thickness. This shows that a TiN layer will reliably nucleate deposition of aluminum. This nucleation facilitates the deposition of very smooth and very thin aluminum layers which is provided by the present invention.

Figure 2A:
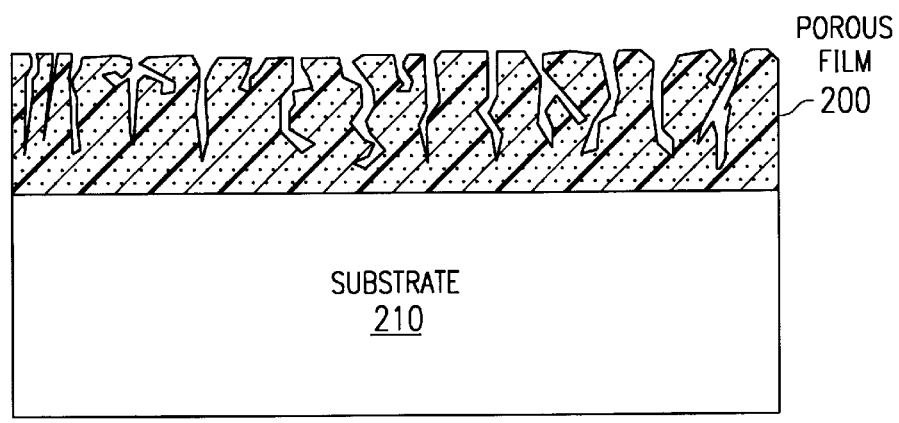
FIG. 2A shows a porous as-deposited film.
Figure 2B:
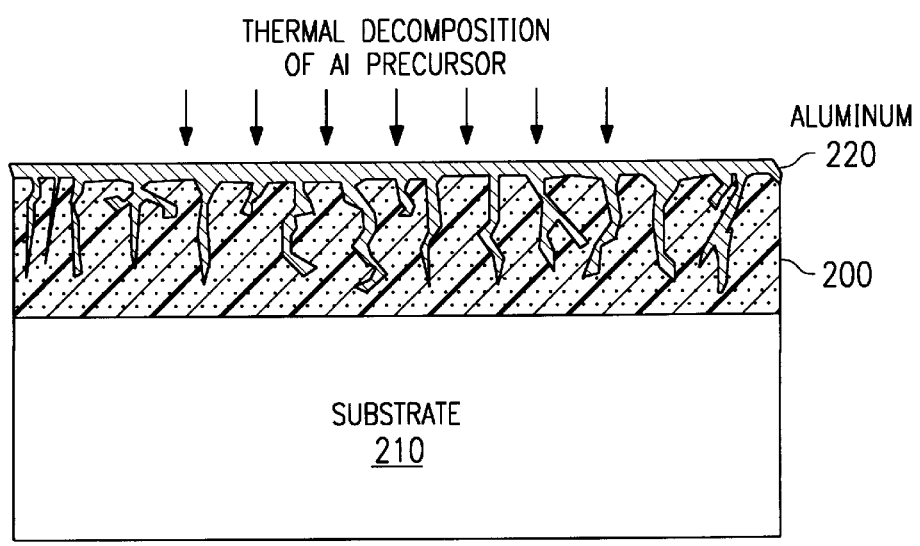
FIG. 2B shows the film of FIG. 2A after the aluminum treatment.

FIG. 2A shows a porous as-deposited film of TiN 200 over a substrate 210. FIG. 2B shows the film of FIG. 2A after the aluminum treatment. The aluminum 220 is deposited into the pores of the TiN film via thermal decomposition and produces a smooth, aluminum-enriched surface layer.

Films deposited using the innovative process disclosed herein have excellent step coverage. This is a significant advantage over PVD processes.

FIRST SAMPLE EMBODIMENT

A first sample embodiment performs the initial TiN deposition from a tetrakisdimethylaminotitanium (TDMAT) feed (e.g. from a bubbler), followed by an aluminum treatment step. Deposition of CVD TiN by the thermal decomposition of TDMAT results in a layer with good step coverage and low particle counts. The following tables give results from actual test runs using sample embodiments of the innovative process described herein.

| Reactor Used: | AMAT P-5000 |
|---|---|
| Starting Surface: | TEOS-deposited oxide |
| First stage: | |
| TDMAT Flow: | 70 sccm |
| N$_2$ Flow: | 100 sccm |
| Susceptor Temp: | 460° C. |
| Total Pressure: | 1200 mTorr |
| Time: | 30 sec |
| Film Thickness: | 40 nm |
| Composition: | porous TiCN |
| Second stage: | |
| Al Source Flow: | 200 sccm of He/AlMe$_2$H (from bubbler) |
| Diluent Flow: | 500 sccm of Ar plus 300 sccm of H$_2$ |
| Susceptor Temp: | 200° C. |
| Total Pressure: | 25000 mTorr |
| Time: | 15 sec |
| Film Thickness: | about 10 nm of Al over TiAlN |

The following table illustrates the results obtained utilizing a third stage consisting of a rapid thermal annealing step, which provided additional stability. Note that the first stage is performed in only 15 seconds as opposed to 30 seconds in the first test run, and the flow of the aluminum source has been reduced by one-half. This embodiment has an improved step coverage over the embodiment shown in the first table.

| Sample Embodiment | |
|---|---|
| Reactor Used: | AMAT P-5000 |
| Starting Surface: | TEOS oxide |
| First stage: | |
| TDMAT Flow: | 70 sccm |
| N$_2$ Flow: | 100 sccm |
| Susceptor Temp: | 460° C. |
| Total Pressure: | 1200 mTorr |
| Time: | 15 sec |
| Composition: | porous Ti—N—C |
| Second stage: | |
| Al Source Flow: | 100 sccm of He/AlMe$_2$H (from bubbler) |
| Diluent Flow: | 500 sccm of Ar plus 300 sccm of H$_2$ |
| Susceptor Temp: | 175° C. |
| Total Pressure: | 25000 mTorr |
| Time: | 15 sec |
| Third stage: | |
| Anneal Temp: | 460° C. |
| Time: | 90 sec |

Figure 6:
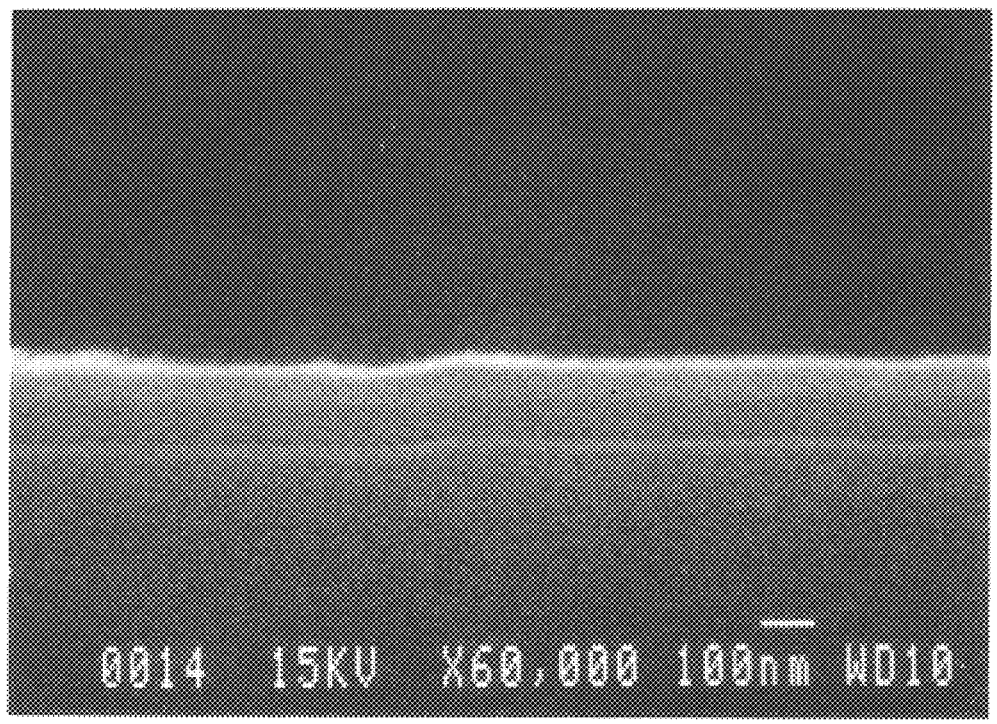
FIG. 6 is a micrograph showing a diffusion barrier fabricated by the methods of FIG. 1.

This process resulted in the diffusion barrier shown in the micrograph of FIG. 6. Note that the surface is very planar.

TiN films deposited directly from TDMAT have been reported to have very high carbon content. However, this has been found not to be a problem for many metallization applications. Leakage measurements on diodes beneath such a TiN diffusion barrier showed no increased leakage. Al plug structures formed using the TiCN containing films have good electromigration resistance.

Alternative Embodiment: TiN deposition from TDEAT

In an alternative embodiment, CVD TiN is deposited by the thermal decomposition of tetrakisdiethylaminotitanium (TDEAT). TiN films deposited directly from TDEAT have been reported to have similar instability problems as in depositions from TDMAT. However, the subsequent aluminum treatment steps disclosed herein circumvent the problems associated with using TDEAT as a sole source gas to deposit TiN.

Alternative Embodiment: TiN deposition from TMEAT

In another alternative embodiment, CVD TiN is deposited by the thermal decomposition of TMEAT. TiN films deposited directly from TDEAT have been reported to have similar instability problems as in depositions from TDMAT. However, the subsequent aluminum treatment steps disclosed herein circumvent the problems associated with using TDEAT as a sole source gas to deposit TiN.

Alternative Embodiment: Al deposition at 175° C.

Low temperatures are preferably used for the aluminum treatment. Preferably the aluminum treatment is performed at 200° C. or less; success has been shown at temperatures as low as 175° C. (Other conditions in this experiment were similar to those specified above.)

Characterization Data

Figure 3:
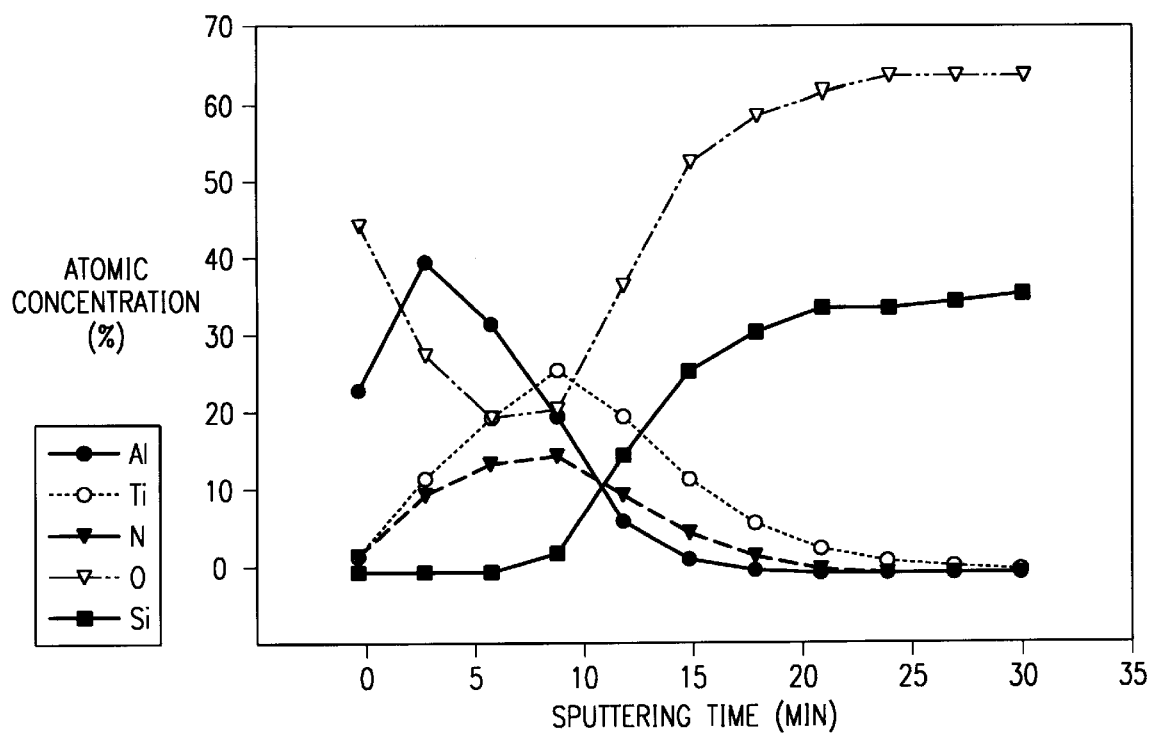
FIG. 3 shows XPS characterization results of the film of FIG. 2B.

FIG. 3 summarizes x-ray photoelectron spectroscopy (XPS) depth profile data for a TiN+Al film deposited by the above described innovative process. The data shows chemical compositions as a function of sputtering time (related to depth). As this data shows, the barrier film structure (after exposure to atmosphere) has a surface oxide layer (approximately $Al_2O_3$), over a layer of aluminum metal, over a layer of nitride wherein the aluminum:titanium ratio shifts from 1:0 to 0:1 over a distance of about 500 Å, over the body of titanium nitride.

The TiN+Al films deposited according to the innovative process described herein enhance the barrier performance and improve the oxidation resistance of metallization structures, of which various examples are disclosed herein.

Sample Metallization Embodiment

Figure 5A:
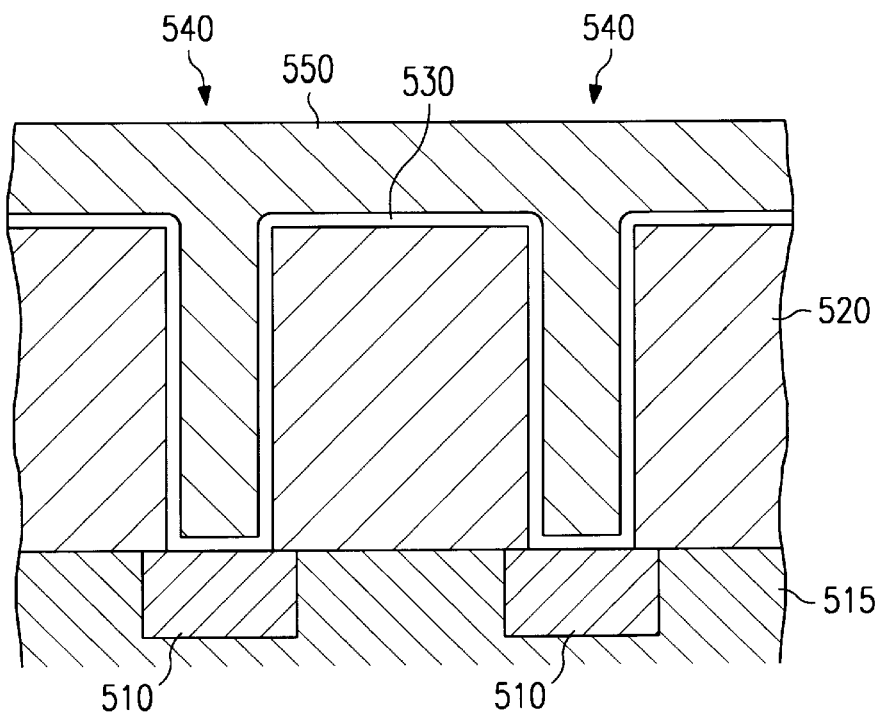
FIGS. 5A and 5B show an example of metallization over a barrier film layer deposited by the disclosed innovative process.

The innovative process disclosed herein can be utilized in metallization applications, particularly for copper (Cu) metallization. For example, in one application, as shown in FIG. 5A, a partially fabricated stricture is provided which includes transistors (not shown) beneath a conductor layer 510 (typically an aluminum alloy) which is surround by a lower interlevel dielectric 515. Thereafter, an upper interlevel dielectric 520 (e.g. BPSG over TEOS-deposited $SiO_2$) is deposited and planarized by conventional methods (e.g. chemical-mechanical polishing, or "CMP"). Thereafter (in a process of the type referred to as a "damascene") the interlevel dielectric 520 is patterned and etched to form slots 530 where lines of metallization are desired, and also to form deeper holes 540 where vias are desired (i.e. where an electrical contact to the underlying conductor layer is desired). Thereafter a diff-usion barrier layer 530 is deposited, using one of the processes described above. A highly conductive metal 550 (e.g. copper) is then deposited overall by conventional methods, and etched back and polished (using e.g. CMP) so that the flat surface of the interlevel dielectric 520 is exposed wherever the metal 550 is not present.

Note that, in this embodiment, the barrier layer provided by the present invention runs over all exposed portions of the interlevel dielectric 520. That is, there are no locations where metal 550 comes directly in contact with the interlevel dielectric 520. This cuts down on the likelihood of copper atoms (or other lifetime killers such as gold) diffusing through an interlevel dielectric into the semiconductor substrate.

Second Sample Metallization Embodiment

Figure 5B:
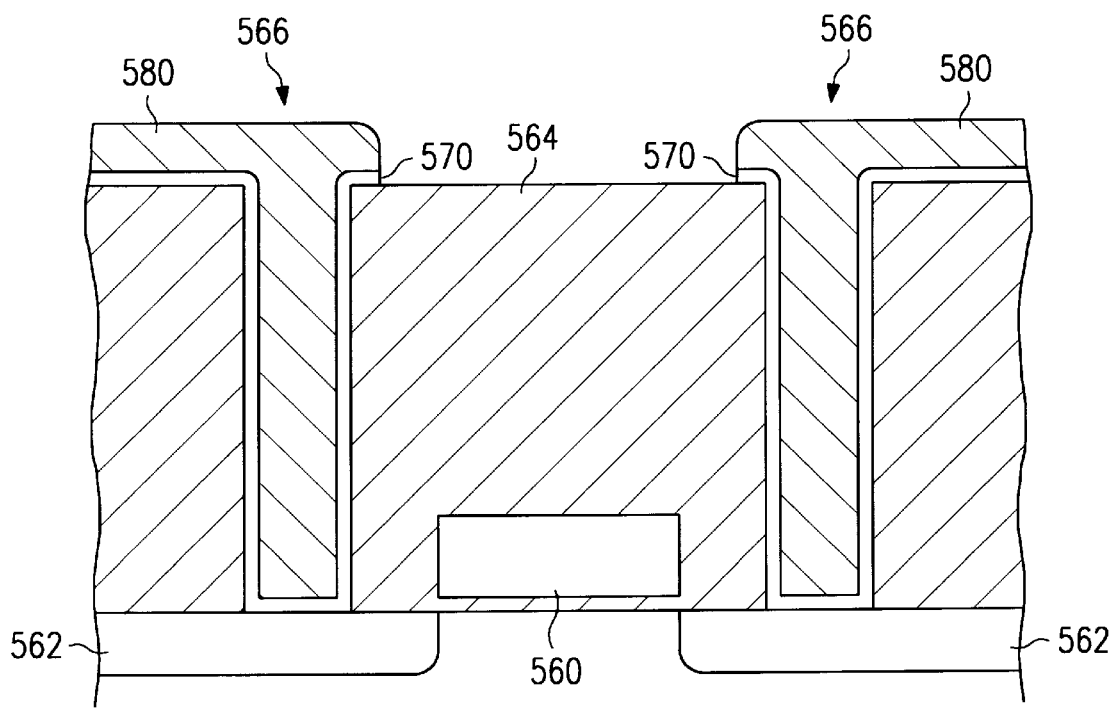

Another metallization embodiment, as shown in FIG. 5B, involves the formation of transistors with polycide gates 560 aligned to source/drain diffusions 562. A first interlevel dielectric layer 564 is subsequently formed. (Optionally, this is often followed by deposition and patterning of additional poly layers with corresponding additional interlevel dielectric layers, but these are not shown.) Contact locations 566 are patterned and etched prior to the deposition of the barrier layer 570 using the innovative processes disclosed herein. The metal layer 580 can then be deposited and patterned. In this sample embodiment, the metal layer 580 is an aluminum alloy, which is forced into the contact hole under superatmospheric pressure (using the "ForceFill™" process, in the presently preferred embodiment).

Third Sample Metallization Embodiment

Figure 5C:
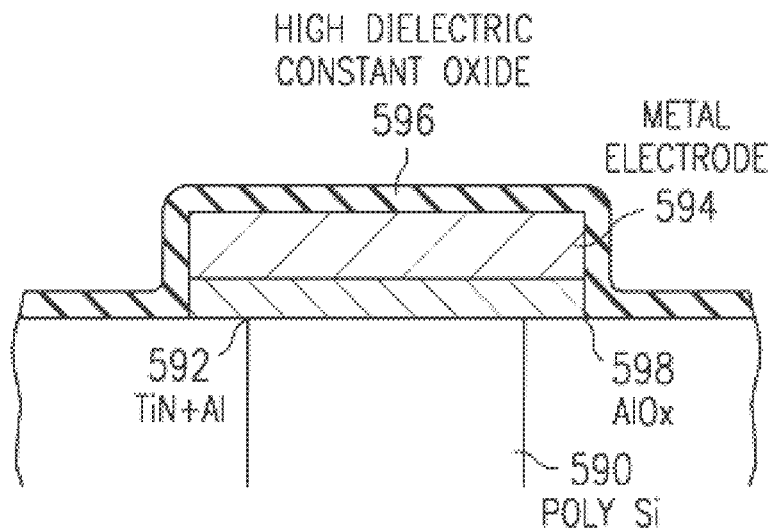
FIG. 5C shows yet another metallization embodiment which uses the innovative TiN+Al films as diffusion barrier for a DRAM capacitor structure.

Yet another metallization embodiment involves the application of TiN+Al films as diffusion barrier for DRAM capacitor application, shown in FIG. 5C. After formation of poly-plug 590, the TiN+Al films 592 are deposited on top of the poly-Si plug 590, followed by deposition of an electrode 594 (e.g. of Pt, Ru, or other metal). After patterning the electrode structure, a high dielectric constant oxide film 596 (e.g. $Ba_xSr_{1-x}Ti_yO_3$) is deposited in a oxidizing environment. Without the barrier action of layer, oxygen will diffuse to the electrode/Si interface (592/590) and form $SiO_x$. The formation of $SiO_x$ is not desirable, since the low dielectric constant $SiO_x$ film is effectively inserted in series, and reduces the effective capacitance of the capacitor cell. With TiN+Al layer 592 as a barrier, oxygen diffusing through electrode metal layer 594 will form a self-limiting $AlO_x$ layer 598 at the interface between electrode metal 594 and TiN+Al diffusion layer. This $AlO_x$ layer 598 can very effectively block further diffusion of oxygen.

According to a disclosed class of innovative embodiments, there is provided: A film fabrication method, comprising the steps of: (a.) depositing a porous thin film which predominantly comprises TiN; and (b.) after said step (a.), introducing aluminum into pores of said porous thin film and onto the surface thereof; whereby said aluminum on the surface of said porous thin film passivates said porous thin film against atmospheric exposure.

According to another disclosed class of innovative embodiments, there is provided: An integrated circuit fabrication method, comprising the steps of: (a) forming transistors; (b) fo(rming an interlevel dielectric layer; (c) patterning and etching said dielectric layer to form holes in contact locations; (d) depositing a porous thin film which predominantly comprises TiN; (e) after said step (d), performing a post-treatment step which introduces aluminum into said porous thin film; and (f) depositing a metal layer.

According to another disclosed class of innovative embodiments, there is provided: A thin film comprising: at a topmost surface thereof, an oxide layer which predominantly comprises alumina; and therebelow an aluminum-rich layer having an Al:Ti atomic ratio which is at least 5:1; and therebelow a composition which varies smoothly to a lower layer having a Ti:Al atomic ratio which is at least 5:1.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

It should also be noted that the number of layers of metallization described above does not implicitly limit any of the claims, which can be applied to processes and structures with more or fewer layers.

Alternatively, $AlH_3$ (through $AlH_3 \cdot NEtMe_2$) or TEA (Al $(C_2H_5)_3$) or other known Al sources can be deposited over the TiN film using CVD processes. $AlH_3$ is more active and smaller in size than $SiH_4$ which provides the benefit of easier Al incorporation into the porous TiCN film.

Alternatively, an aluminum predeposition step can be performed at low or very low temperatures, and then the wafer can be heated to cause the decomposition of the aluminum precursor.

Alternatively and less preferably, other techniques (such as rapid sputter deposition) can be used for initial deposition of a porous TiN layer.

The innovative process of the present invention provides significant advantages in hard coating applications. Coating of bulk articles using the innovative method described herein eliminates the need to provide a protective coating on such articles.

General background on CVD and metallization is found in the following publications, which help to show the knowledge of those skilled in the art regarding variations and implementations: METALLIZATION AND METAL-SEMICONDUCTOR INTERFACES (ed. Batra 1989); VLSI METALLIZATION: PHYSICS AND TECHNOLOGIES (ed. Shenai 1991); Murarka, METALLIZATION THEORY AND PRACTICE FOR VLSI AND ULSI (1993); HANDBOOK OF MULTILEVEL METALLIZATION FOR INTEGRATED CIRCUITS (ed. Wilson et al. 1993); Rao, MULTLEVEL INTERCONNECT TECHNOLOGY (1993); CHEMICAL VAPOR DEPOSITION (ed. M. L. Hitchman 1993); and the semiannual conference proceedings of the Electrochemical Society on CVD; all of which are hereby incorporated by reference.

What is claimed is:

1. A film fabrication method, comprising the steps of:
   (a.) depositing a porous thin film which predominantly comprises TiN; and
   (b.) after said step (a.), performing a post-treatment step which introduces aluminum into pores of said porous thin film and onto the surface thereof;
   whereby said aluminum on the surface of said porous thin film passivates said porous thin film against atmospheric exposure.

2. The method of claim 1, further comprising the step of, after said introducing step, performing a post-deposition thermal treatment step.

3. The method of claim 1, wherein said step of depositing said porous thin film uses the thermal decomposition of an amino-complexed titanium compound.

4. The method of claim 1, wherein said step of introducing is performed at a temperature of 200° C. or less.

5. The method of claim 1, wherein said step of performing said post-treatment step performs said post-treatment step using a silicon precursor admixed with aluminum.

6. An integrated circuit fabrication method, comprising the steps of:
   (a.) forming transistors;
   (b.) forming an interlevel dielectric layer;
   (c.) patterning and etching said dielectric layer to form holes in contact locations;
   (d.) depositing a porous thin film which predominantly comprises TiN;
   (e.) after said step (d.), performing a post-treatment step which introduces aluminum into said porous thin film; and
   (f.) depositing a metal layer.

7. The method of claim 6, further comprising the step of after said step of performing said post-treatment step, performing a post-deposition thermal treatment step.

8. The method of claim 6, wherein said step of depositing said porous thin film uses the thermal decomposition of an amino-complexed titanium compound.

9. The method of claim 6, wherein said step of introducing is performed at a temperature of 200° C. or less.

10. The method of claim 6, wherein said step of performing said post-treatment step performs said post-treatment step using a silicon precursor admixed with aluminum.

* * * * *